(12) United States Patent
Ohsawa et al.

(10) Patent No.: US 8,569,742 B2
(45) Date of Patent: Oct. 29, 2013

(54) ORGANIC FIELD-EFFECT TRANSISTOR AND SEMICONDUCTOR DEVICE INCLUDING THE SAME

(75) Inventors: Nobuharu Ohsawa, Zama (JP);
Yoshiharu Hirakata, Ebina (JP);
Shinobu Furukawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 721 days.

(21) Appl. No.: 11/792,232

(22) PCT Filed: Dec. 5, 2005

(86) PCT No.: PCT/JP2005/022714
§ 371 (c)(1),
(2), (4) Date: Jun. 4, 2007

(87) PCT Pub. No.: WO2006/062217
PCT Pub. Date: Jun. 15, 2006

(65) Prior Publication Data
US 2008/0048183 A1   Feb. 28, 2008

(30) Foreign Application Priority Data

Dec. 6, 2004   (JP) ................................. 2004-353455

(51) Int. Cl.
*H01L 29/08* (2006.01)
(52) U.S. Cl.
USPC ........... 257/40; 257/57; 257/59; 257/E29.117
(58) Field of Classification Search
USPC .................. 257/57, 59, 72, 79, 83, 347, 348, 257/E29.117, E29.137, E29.273, E29.289, 257/E51.01, E51.002, E51.003, E27.115, 257/E27.116, E27.107, 40
See application file for complete search history.

(56) References Cited

U.S. PATENT DOCUMENTS 6,013,384 A   1/2000   Kido et al.
6,486,601 B1   11/2002   Sakai et al.
(Continued)

FOREIGN PATENT DOCUMENTS

EP   0855848 A   7/1998
EP   1383179 A   1/2004
(Continued)

OTHER PUBLICATIONS

International Search Report (Application No. PCT/JP2005/022714) dated Jan. 24, 2006.
(Continued)

*Primary Examiner* — Cuong Q Nguyen
*Assistant Examiner* — Yosef Gebreyesus
(74) *Attorney, Agent, or Firm* — Eric J. Robinson; Robinson Intellectual Property Law Office, P.C.

(57) ABSTRACT

It is an object to provide an electrode for an organic field-effect transistor having a semiconductor layer formed of an organic semiconductor material (in the present invention, referred to as an organic field-effect transistor), which can reduce the energy barrier at an interface with the semiconductor layer. A composite layer including an organic compound and a metal oxide is used for the electrode for the organic field-effect transistor, in other words the composite layer is used for at least a part of either a source electrode or a drain electrode in the organic field-effect transistor.

24 Claims, 11 Drawing Sheets

(56) References Cited

U.S. PATENT DOCUMENTS

| | | | |
|---|---|---|---|
| 6,589,673 B1 | 7/2003 | Kido et al. | |
| 6,992,324 B2 | 1/2006 | Nagayama | |
| 7,038,237 B2 | 5/2006 | Nagayama | |
| 7,049,629 B2* | 5/2006 | Wu et al. | 257/40 |
| 7,560,735 B2* | 7/2009 | Furukawa et al. | 257/72 |
| 8,049,208 B2* | 11/2011 | Imahayashi et al. | 257/40 |
| 2001/0046611 A1 | 11/2001 | Kido et al. | |
| 2002/0045289 A1* | 4/2002 | Dimitrakopoulos et al. | 438/99 |
| 2003/0080426 A1* | 5/2003 | Klauk et al. | 257/744 |
| 2003/0092214 A1 | 5/2003 | Klauk et al. | |
| 2003/0218166 A1* | 11/2003 | Tsutsui | 257/40 |
| 2004/0012017 A1* | 1/2004 | Nagayama | 257/40 |
| 2004/0108562 A1 | 6/2004 | Nagayama et al. | |
| 2004/0161873 A1* | 8/2004 | Dimitrakopoulos et al. | 438/99 |
| 2004/0206959 A1* | 10/2004 | Heeger et al. | 257/72 |
| 2005/0042548 A1 | 2/2005 | Klauk et al. | |
| 2005/0057136 A1* | 3/2005 | Moriya et al. | 313/311 |
| 2005/0084712 A1* | 4/2005 | Kido et al. | 428/690 |
| 2005/0098207 A1 | 5/2005 | Matsumoto et al. | |
| 2005/0170208 A1 | 8/2005 | Yatsunami et al. | |
| 2005/0248267 A1 | 11/2005 | Gyoutoku et al. | |
| 2005/0285101 A1* | 12/2005 | Hanson et al. | 257/40 |
| 2006/0008740 A1 | 1/2006 | Kido et al. | |
| 2006/0081880 A1* | 4/2006 | Miyazaki et al. | 257/200 |
| 2006/0097623 A1* | 5/2006 | Abe et al. | 313/498 |

FOREIGN PATENT DOCUMENTS

| | | |
|---|---|---|
| EP | 1 398 840 | 3/2004 |
| GB | 2379085 | 2/2003 |
| JP | 03-274695 | 12/1991 |
| JP | 09-063771 | 3/1997 |
| JP | 10-270172 A | 10/1998 |
| JP | 11-307264 | 11/1999 |
| JP | 11-307264 A | 11/1999 |
| JP | 2002-204012 | 7/2002 |
| JP | 2003-298056 | 10/2003 |
| JP | 2004-055652 A | 2/2004 |
| JP | 2004-103905 | 4/2004 |
| JP | 2004-228371 | 8/2004 |
| JP | 2004-527122 | 9/2004 |
| JP | 2005-026121 | 1/2005 |
| JP | 2005-026121 A | 1/2005 |
| KR | 1998-0070765 A | 10/1998 |
| WO | 02/082560 | 10/2002 |
| WO | 2005/031798 | 4/2005 |

OTHER PUBLICATIONS

Written Opinion (Application No. PCT/JP2005/022714) dated Jan. 24, 2006.

Lin et al., *Stacked Pentacene Layer Organic Thin-Film Transistors with Improved Characteristics*, IEEE Electron Device Letters, vol. 18, No. 12, Dec. 1997, pp. 606-608.

Search Report (Application No. 05814345.4) dated Feb. 18, 2010.

* cited by examiner

# ORGANIC FIELD-EFFECT TRANSISTOR AND SEMICONDUCTOR DEVICE INCLUDING THE SAME

TECHNICAL FIELD

The present invention relates to an organic field-effect transistor which can be used as a switching element or an amplifying element. Also, the present invention relates to a semiconductor device comprising the organic field-effect transistor.

BACKGROUND ART

A field-effect transistor controls electric conductivity of a semiconductor layer provided between a source electrode and a drain electrode, using voltage applied to a gate electrode. Basically, a field-effect transistor is a representative example of unipolar element in which either p-type carriers or n-type carriers (hole or electron) transport electric charge.

These field-effect transistors can form various switching elements or amplifying elements, depending on the combination; therefore the field-effect transistors are applied in various areas. For example, a switching element and the like for a pixel of an active matrix type display can be given as an application example.

As a semiconductor material used for a field-effect transistor, an inorganic semiconductor material typified by silicon has been widely used in the past. However, it is difficult to use a plastic substrate or a film for a substrate since a treatment at high temperature is necessary to form an inorganic semiconductor material as a semiconductor layer.

On the other hand, when an organic semiconductor material is used as a semiconductor layer, it is possible to form a film with relatively low temperature. Therefore, in principle, a field-effect transistor can be manufactured over a plastic substrate, etc. which does not offer resistance to high temperatures, as well as a glass substrate.

As described above, as an example of a field-effect transistor using an organic semiconductor material as a semiconductor layer (hereinafter, referred to as an "organic field-effect transistor"), a transistor using silicon dioxide ($SiO_2$) as a gate insulating layer and pentacene as a semiconductor layer (refer to Non Patent Document 1) can be given. According to the report, the electron field-effect mobility is reported as 1 $cm^2/Vs$, and it is also reported that the transistor performance which is equal to amorphous silicon can be obtained, even when an organic semiconductor material is used as a semiconductor layer.

By the way, in an organic field-effect transistor, carriers are transported between source and drain electrodes and a semiconductor layer, however the transistor characteristic, such as the electron field-effect mobility, is declined when the energy barrier exists at the interface between the source electrode and the semiconductor layer and between the drain electrode and the semiconductor layer. In order to improve it, it is proposed to use a lithium fluoride layer for the interface between the source electrode and the semiconductor layer and between the drain electrode and the semiconductor layer (refer to Patent Document 1), however, since it can be applied only for an n-channel type organic field-effect transistor, a kind of an organic semiconductor material is limited to the n-type. In addition, it is also proposed to dope the semiconductor layer with a conductivity imparting agent (refer to Patent Document 2), however, there is a problem that the conductivity imparting agent has low chemical stability. Furthermore, the adhesiveness between these electrode materials and organic semiconductor materials is also important in order to obtain a transistor having excellent resistance.

Thus, source and drain electrodes which can be used for an organic field-effect transistor using various organic semiconductor materials, which are chemically stable, and has good adhesiveness to the organic semiconductor material, are hoped for. It is because that an organic field-effect transistor having favorable electron field-effect mobility and excellent resistance can be obtained by applying such source and drain electrodes.

In addition, in an organic field-effect transistor, since source and drain electrodes are also used as wirings, high conductivity is required. However, source and drain electrodes having the above described characteristics and high conductivity have not been reported yet.

[Non Patent Document 1]
Y. Y. Lin, D. J. Gundlach, S. F. Nelson, T. N. Jackson, IEEE Electron Device Letters, Vol. 18, 606-608 (1997)
[Patent Document 1]
Japanese Patent Laid-Open No. 2003-298056
[Patent Document 2]
Japanese Patent Laid-Open No. 2004-228371

DISCLOSURE OF INVENTION

It is an object of the present invention to provide an organic field-effect transistor which can reduce the energy barrier at an interface with a semiconductor layer formed of an organic semiconductor material (in the present invention, referred to as an "organic field-effect transistor"). It is another object of the present invention to provide an organic field-effect transistor which can use various organic semiconductor materials. In addition, it is another object of the present invention to provide an organic field-effect transistor which is chemically stable, and to provide an electrode material for an organic field-effect transistor, which has excellent adhesiveness to a semiconductor layer.

Furthermore, it is another object of the present invention to provide an electrode material for an organic field-effect transistor, which can also be used as a wiring and has excellent conductivity in addition to characteristics described above.

In an organic field-effect transistor, when an electrode is selected in order to inject carriers efficiently, it is necessary to consider the work function thereof. Further, the restriction of the selection is severe, in the present circumstance, only a few conductive layers fulfilling requirements can be used. For example, as a conductive layer commonly used as an electrode for a p-type organic field-effect transistor, gold is given, however it is necessary to fulfill the work function, using such an expensive precious metal.

Consequently, when a conductive material is used as a part of an electrode for an organic field-effect transistor in the present invention, it is an object to provide an organic field-effect transistor having a structure which is not affected by the work function of a material used for the electrode.

Furthermore, it is an object of the present invention to provide an organic field-effect transistor having favorable electron field-effect mobility, and an organic field-effect transistor having excellent resistance.

As a result of earnest studies, the present inventors found out that the energy barrier at an interface between a source electrode and a semiconductor layer and between a drain electrode and the semiconductor layer is reduced, and the electron field-effect mobility is increased when a composite layer including an organic compound and a metal oxide is used as a part of at least either a source electrode or a drain electrode.

In addition, the inventors found out that when the electrode having such a structure is used as a source electrode and/or a drain electrode for an organic field-effect transistor, it is chemically stable and has excellent adhesiveness to a semiconductor layer.

Therefore, in an aspect of the present invention, an electrode of an organic field-effect transistor partly has a composite layer including an organic compound and a metal oxide.

In this case, as the organic compound, an aromatic amine compound is preferable. In addition, as the metal oxide, a transition metal oxide is preferable, especially, a titanium oxide, a zirconium oxide, a hafnium oxide, a vanadium oxide, a niobium oxide, a tantalum oxide, a chromium oxide, a molybdenum oxide, a tungsten oxide, a rhenium oxide, and a ruthenium oxide are preferable. Further, a nitride or a nitride oxide thereof can also be used.

In another aspect of the present invention, the electrode for an organic field-effect transistor described above further has a second layer including any of an alkali metal, an alkaline earth metal, an alkali metal compound, or an alkaline earth metal compound, wherein the second layer is provided to be in contact with the composite layer.

Note that the source electrode and/or the drain electrode for an organic field-effect transistor described above preferably further include/includes a conductive layer. Thus, source and drain electrodes which have excellent conductivity and can also be used as wirings, can be obtained.

Also, in an aspect of the present invention, an organic field-effect transistor has a semiconductor layer including an organic semiconductor material and source and drain electrodes, wherein at least either the source electrode or the drain electrode has a composite layer including an organic compound and a metal oxide.

In this case, as the organic compound, an aromatic amine compound is preferable. In addition, as the metal oxide, a transition metal oxide is preferable, especially, a titanium oxide, a zirconium oxide, a hafnium oxide, a vanadium oxide, a niobium oxide, a tantalum oxide, a chromium oxide, a molybdenum oxide, a tungsten oxide, a rhenium oxide, and a ruthenium oxide are preferable.

Furthermore, since the composite layer has excellent adhesiveness to the semiconductor layer, the composite layer is preferably provided to be in contact with the semiconductor layer.

In another aspect of the above described organic field-effect transistor of the present invention, at least either the source electrode or the drain electrode has a second layer including any of an alkali metal, an alkaline earth metal, an alkali metal compound, or an alkaline earth metal compound, wherein the second layer is provided between the semiconductor layer and the composite layer.

In the above described organic field-effect transistor of the present invention, the source electrode and/or the drain electrode preferably further have/has a conductive layer. Thus, source and drain electrodes which have excellent conductivity and can also be used as wirings, can be obtained.

Note that, in the above described composite layer, the mixture ratio between the organic compound and the metal oxide is organic compound/metal oxide=0.1 to 10, preferably in the range of 0.5 to 2 in molar ratio.

In addition, in another aspect of the present invention, the above described organic field-effect transistor further has the conductive layer, wherein end portions of the conductive layer are covered with a composite layer including an organic compound and a metal oxide.

Carrying out the present invention enables source and drain electrodes which can reduce the energy barrier at an interface with a semiconductor layer to be obtained, in a field-effect transistor having a semiconductor layer formed of an organic semiconductor material. Source and drain electrodes which can be used for various organic semiconductor materials, can be obtained. In addition, source and drain electrodes which are chemically stable, can be obtained. Further, source and drain electrodes which have good adhesiveness to a semiconductor layer, can be obtained.

In addition, an organic field-effect transistor of the present invention can select a conductive material regardless of the restriction of the work function thereof, and the choice of selection is widened, which is an advantageous structure in terms of cost. The resistance can also be reduced by using the conductive material, and the electrode can preferably be used as a wiring.

Furthermore, carrying out the present invention enables an organic field-effect transistor having favorable electron field-effect mobility to be provided. It also enables an organic field-effect transistor having superior resistance to be provided. Similarly, carrying out the present invention enables a semiconductor device having good operation characteristic and high reliability.

BEST MODE FOR CARRYING OUT THE PRESENT INVENTION

Figure 1A:
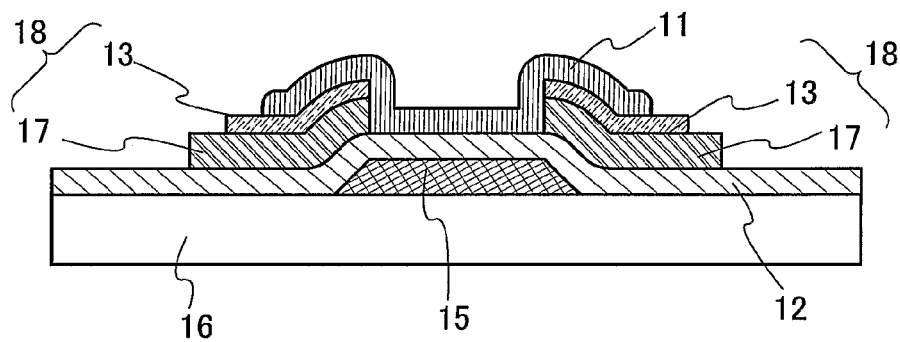
FIGS. 1A to 1D each shows a frame format of a constructional example of an organic field-effect transistor according to the present invention.

As for an organic field-effect transistor of the present invention, in order to obtain an excellent characteristic of a field-effect transistor, it is necessary that supply of carriers from a source electrode to an organic semiconductor layer, and discharge of the carriers from the organic semiconductor layer to a drain electrode are carried out efficiently, in addition to that the carrier density of the organic semiconductor layer is controlled efficiently by the electric field effect. For these, it is desirable that there is no energy barrier between the source and drain electrodes and the organic semiconductor layer. However, the energy barrier exists since there is generally the energy difference between the Fermi level of an electrode metal and the highest occupied level of the organic semiconductor material, which is one factor limiting the characteristic of the organic field-effect transistor, and is one of the reasons that the work function has to be considered at the time of selecting an electrode material.

The present inventors found out that using a composite layer including an organic compound and a metal oxide as a part of source and drain electrodes enables the energy barrier between the source electrode and an organic semiconductor layer and between the drain electrode and the organic semiconductor layer to be reduced, and supply of carriers from the source electrode to the organic semiconductor layer and discharge of the carriers from the organic semiconductor layer to the drain electrode layer to occur efficiently, and thus the characteristic of the field-effect transistor is increased.

It is thought that this phenomenon is caused by the formation of a charge-transfer complex between the organic compound and the metal oxide in the composite layer in which the organic compound and the metal oxide are mixed, and the increase in the carrier density in the composite layer.

Embodiment Mode 1

A constructional example of an organic field-effect transistor of the present invention will be described with reference to FIGS. 1A to 1D. Note that reference numeral 11 denotes a semiconductor layer including an organic semiconductor material; 12, an insulating layer; 13, a composite layer; 15, a gate electrode; and 16, a substrate. Each of source and drain electrodes 18 includes the composite layer 13 and a conductive layer 17. The alignment of each layer and each electrode can be appropriately selected in accordance with an application of an element. In the drawings, the composite layer 13 is provided to be in contact with the semiconductor layer 11, however the present invention is not limited to this, and the composite layer 13 may be included in a part of the source electrode and/or the drain electrode. The alignment of each layer and the electrode can be appropriately selected from FIGS. 1A to 1D in accordance with an application of an element.

As the substrate 16, an insulating substrate such as a glass substrate, a quartz substrate, and a crystalline glass substrate; a ceramic substrate; a stainless steel substrate; a metal substrate (tantalum, tungsten, molybdenum, etc.); a semiconductor substrate; a plastic substrate (polyimide, acrylic, polyethylene terephthalate, polycarbonate, polyalylate, polyethelsulfone, etc.); and the like can be used. In addition, these substrates may be used after being polished with CMP, etc. if necessary.

The insulating layer 12 can be formed of an inorganic insulating material such as silicon oxide, silicon nitride, silicon oxide containing nitrogen and silicon nitride containing oxygen; an organic insulating material such as acrylic and polyimide; a so-called siloxane based material having a skeleton structure combining silicon with oxygen, having at least hydrogen as a substituent, and having at least one kind from fluorine, an alkyl group or aromatic hydrocarbon as a substituent. In addition, the insulating layer 12 may be formed to have a single layer, but may also be formed to have multiple layers. In a case of forming the insulating layer with two layers, it is preferable that an inorganic insulating material be formed as a first insulating layer and an organic insulating material be stacked thereon as a second insulating layer.

These insulating films can be formed by a known method, such as a coating method such as a dipping method, a spin coating method, a droplet discharging method; a CVD method; or a sputtering method. Unevenness at the lower layer can be reduced.

Any of a small molecule, a middle molecule, or a high molecule can be used as an organic semiconductor material used in the present invention, as long as the organic semiconductor material has a carrier transport property and the modulation in the carrier density occurs, and the kind thereof is not especially limited. As a small molecule, a polycyclic aromatic compound such as pentacene and naphthacene; a conjugated double bond system compound; a macrocycle compound or a complex thereof; phthalocyanine; a charge transfer type complex; tetrathiafulvalene: tetracyanoquinodimethane complex; or the like can be given. As a high molecule, p-conjugated system polymer; a charge transfer type complex; polyvinyl pyridine; a phthalocyanine metal complex; or the like can be given, however it is more preferable to use polyacetylene; polyaniline; polypyrrole; polyethylene; polythiophene derivatives; or the like which are p-conjugated system polymer constituted by conjugated double bond.

These organic semiconductor materials can be formed by a know method such as an evaporation method, a spin coating method or a droplet discharging method.

The conductive layer 17 which is used for the gate electrode 15 and the source and drain electrodes in the present invention, is not especially limited. However, a metal such as platinum, gold, aluminum, chromium, nickel, cobalt, copper, titanium, magnesium, calcium, barium, and sodium; an alloy including these metals; a conductive high molecule compound such as polyaniline, polypyrrole, polythiophene, polyacetylene, and polydiacetylene; an inorganic semiconductor such as silicon, germanium, gallium arsenide; a carbonate material such as carbon black, fullerene, carbon nanotube, and graphite; and further, these materials doped with acid (including Lewis acid), a halogen atom, a metal atom such as an alkali metal and an alkaline earth metal, can also be given. Generally, a metal is used as a conductive material used for source and drain electrodes in many cases.

These electrode materials may be formed by a known method, for example by being etched after forming a film by a sputtering method or an evaporation method.

A kind of an organic compound used as the composite layer 13 of the present invention is not especially limited, however a material having a hole transport property is preferable. In addition, for example, a material having an aromatic amine skeleton such as 4,4'-bis[N-(1-naphthyl)-N-phenylamino]biphenyl (hereinafter, NPB); N,N'-diphenyl-N,N'-bis(3-methylphenyl)-1,1'-biphenyl-4,4'-diamine (hereinafter, TPD); 4,4'-bis(N-{4-[N,N-bis(3-methylphenyl)amino]phenyl}-N-phenylamino)biphenyl (hereinafter, DNTPD); 4,4',4"-tris[N-(3-methylphenyl)-N-phenylamino]triphenylamine (hereinafter, m-MTDATA); 4,4',4"-tris[N-(1-naphthyl)-N-phenylamino]triphenylamine (hereinafter, 1-TNATA), is preferable. Note that a material for the semiconductor layer 11 can also be used.

A metal oxide used for the composite layer 13 of the present invention is not especially limited, however an oxide of titanium, vanadium, chromium, zirconium, niobium, molybdenum, hafnium, tantalum, tungsten or rhenium is preferable.

Further, the composite layer 13 may be formed using these materials by co-evaporation using resistance heating;

co-evaporation using resistance heating evaporation and electron gun evaporation (EB evaporation); simultaneous deposition using sputtering and resistance heating; or the like. In addition, the composite layer 13 may be formed by a wet method such as a sol-gel method.

The electric conductivity of the composite layer 13 is approximately $10^{-5}$[S/cm], which is high, and there is few change in the value of the transistor resistance even when the thickness thereof is changed from several nm to several hundreds nm. Therefore, the thickness of the composite layer 13 can be appropriately adjusted from several nm to several hundreds nm or more, in accordance with an application and a shape of an element to be manufactured.

The structure shown in FIG. 1A will be used as an example in order to describe the present invention in more detail. This structure is suitable for a p-type organic field-effect transistor having holes as carriers. As shown in FIG. 1A, the gate electrode 15 is formed over the substrate 16, the insulating layer 12 is formed over the gate electrode 15, and the source and drain electrodes 18 are formed over the insulating layer 12. The gate electrode has a tapered shape in FIG. 1A, but the shape of a gate electrode is not limited to this in the present invention. The conductive layer 17 is formed over the insulating film 12, the composite layer 13 is stacked thereon, and the source and drain electrodes 18 are formed. Note that, the conductive layer 17 and the composite layer 13 may be formed by using the same mask and an edge portion of the conductive layer 17 may coincide with an edge portion of the conductive layer 13. And, the semiconductor layer 11 is formed so as to exist at least between the source electrode and the drain electrode. The semiconductor layer 11 is formed so as to partially overlap with the source and drain electrodes 18 in FIG. 1A. The composite layer 13 is provided to be in contact with the semiconductor layer 11. In the structure of FIG. 1A, after the conductive layer 17 is formed, surface oxidation and topographical modifications are likely to occur. As a consequence, when the conductive layer 17 is solely used as the source and drain electrodes 18, an energy barrier appears between the source electrode and the semiconductor layer and between the drain electrode and the semiconductor layer, and the performance of a transistor easily declines. However, by interposing the composite layer 13, between the semiconductor layer 11 and the conductive layer 17, the height of the energy barrier is lowered.

Figure 1B:
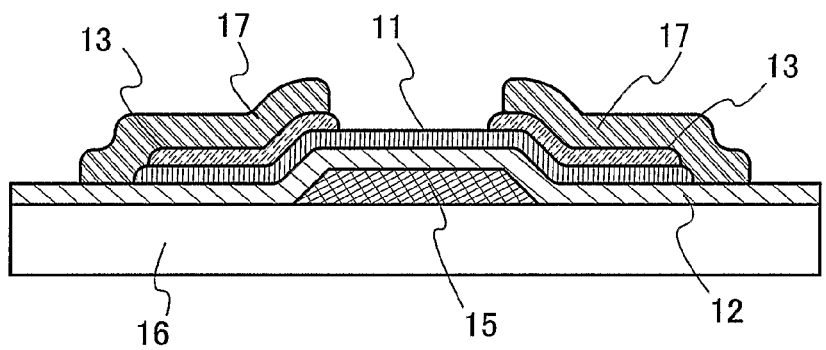
Figure 1C:
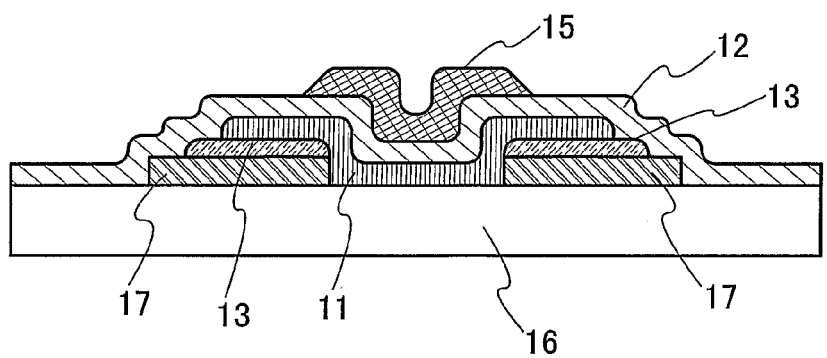
Figure 1D:
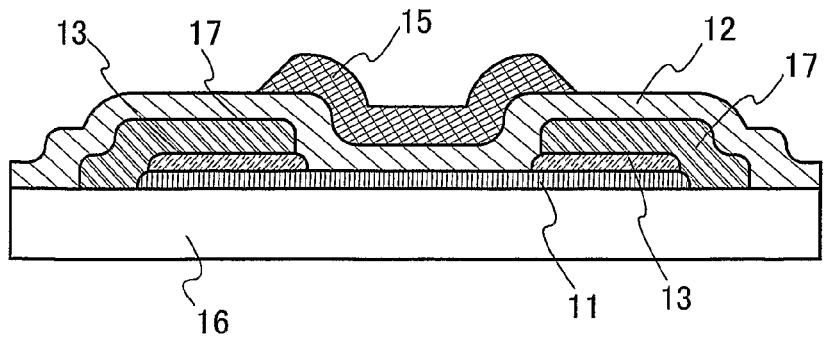

The transistor shown in FIG. 1A has a bottom gate type and a bottom contact type structure. In the bottom contact type structure, source and drain electrodes are formed over a substrate and a semiconductor layer is formed over the source and drain electrodes (the source and drain electrodes are in contact with a lower surface of the semiconductor layer). FIG. 1B is an organic field-effect transistor having a bottom gate type and a top contact type structure. The top contact type structure indicates a structure in which a semiconductor layer is formed over a substrate and source and drain electrodes are formed over the semiconductor layer (the source and drain electrodes are in contact with an upper surface of the semiconductor layer). FIG. 1C is an organic field-effect transistor having a top gate type and a bottom contact type structure and FIG. 1D is an organic field-effect transistor having a top gate type and a top contact type structure.

As described above, applying the source and drain electrodes having the structure in which the composite layer 13 is put between the semiconductor layer 11 and the conductive layer 17 enables the energy barrier between the semiconductor layer 11 and the source and drain electrodes 18 to be decreased, and enables the injection of carriers from the source electrode to the semiconductor layer and the discharge of the carriers from the semiconductor layer to the drain electrode to become smooth. Therefore, the conductive layer 17 can be selected regardless of the restriction of the work function. As shown in FIGS. 1A and 1C, one edge portion of the composite layer 13 may coincide with one edge portion of the conductive layer 17. As shown in FIGS. 1B and 1D, an edge portion of the composite layer 13 may extend beyond a side surface (or an edge portion) of the conductive layer 17, over the semiconductor layer 11.

In addition, the composite layer 13 is chemically stable, and the adhesiveness of the composite layer 13 to the semiconductor layer 11 is favorable, as compared with the conductive layer 17. Furthermore, by combining the composite layer 13 with the conductive layer 17 like this structure, the source and drain electrodes 18, which have excellent conductivity and can also be used as wirings, can be provided.

As described above, applying the source and drain electrodes of this structure enables an organic field-effect transistor having favorable electron field-effect mobility to be provided. In addition, an organic field-effect transistor having excellent durability can be provided.

Using the composite layer 13 enables the energy gap between the source and drain electrodes 18 and the semiconductor layer 11 to be decreased, and therefore, as a material for the source and drain electrodes, it is not necessary to select a material having low energy barrier with the semiconductor layer 11 (in other words, there is no restriction of the work function), which is one of the advantages of the present invention.

Embodiment Mode 2

Next, a structure which is suitable for an n-type organic field-effect transistor having an electron as a carrier will be described as an example. This structure has a second layer 14 further including an alkali metal, an alkaline earth metal, or a compound (oxide, nitride or salt) including them, in addition to the structure of Embodiment Mode 1 having the composite layer 13 in a part of the source and drain electrodes.

An organic semiconductor material used in the present invention is not especially limited. However, specifically as the organic semiconductor material showing the characteristic as an n-channel field-effect transistor, perylenetetracarboxylic acid anhydride and derivatives thereof; perylenetetracarboxydiimide derivatives; naphthalenetetracarboxylic acid anhydride and derivatives thereof; naphthalenetetracarboxydiimide derivatives; metallophthalocyanine derivatives; fullerene; and the like, are preferable.

A kind of an alkali metal and an alkaline earth metal, or oxide, nitride or salt including them used for the second layer 14 of the present invention, is not especially limited, however, lithium, sodium, potassium, cesium, magnesium, calcium, strontium, barium, lithium oxide, magnesium nitride, calcium nitride are preferable. In addition, the second layer 14 may be formed of a mixture material of these materials and an organic compound having an electron transport property. As the organic compound having the electron transport property, in addition to perylenetetracarboxylic acid anhydride and derivatives thereof; perylenetetracarboxylic diimie derivatives; naphthalenetetracarboxylic acid anhydride and derivatives thereof; naphthalenetetracarboxydiimide derivatives; metallophthalocyanine derivatives; and fullerene. Also a material formed of a metal complex or the like having quinoline skeleton or benzoquinoline skeleton, such as tris(8-quinolinolate)aluminum (abbreviation: $Alq_3$), tris(4-methyl-8-quinolinolate)aluminum (abbreviation: $Almq_3$), bis(10-hydroxybenzo[h]quinolinato)beryllium (abbreviation:

BeBq$_2$), bis(2-methyl-8-quinolinolate)-(4-phenylphenolato) aluminum (abbreviation: BAlq) can be used. In addition, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can also be used. Further, 2-(4-biphenylyl)-5-(4-tert-butylphenyl)-1,3,4-oxadiazole (abbreviation: PBD), 1,3-bis[5-(4-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ),3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP) or the like can be used, in addition to the metal complex.

A constructional example of the organic field-effect transistor of the present invention will be described with reference to FIGS. 2A to 2D. Note that reference numeral 11 denotes a semiconductor layer including an organic semiconductor material; 12, an insulating layer; 15, gate electrode; and 16, a substrate. Source and drain electrodes 18 include a composite layer 13, a second layer 14 and a conductive layer 17. In addition, the second layer 14 is provided between the composite layer 13 and the semiconductor layer 11. The alignment of each layer and the electrode can be appropriately selected from FIGS. 2A to 2D in accordance with an application of an element. FIGS. 2A to 2D have the structure in which the second layer is further provided in the structure shown in FIGS. 1A to 1D, respectively. Therefore, the detail explanation about the element structure is omitted here. In the drawings, the second layer 14 is provided to be in contact with the composite layer 13 and the semiconductor layer 11, however the present invention is not limited to this, and the second layer 14 may be included in a part of the source electrode and/or the drain electrode.

Figure 2A:
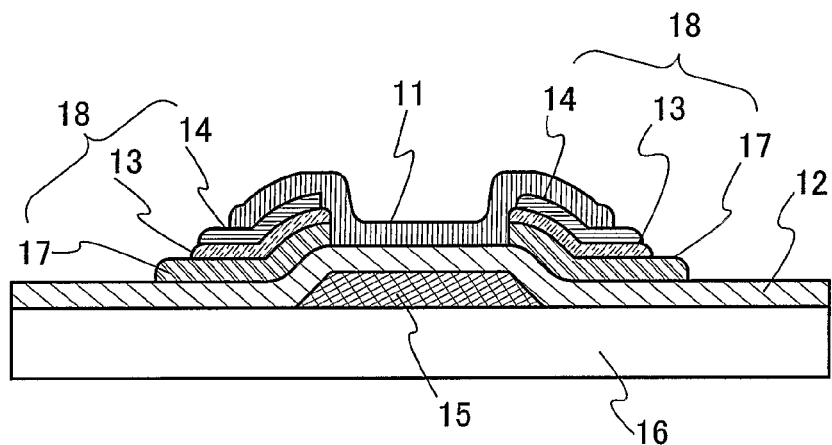
FIGS. 2A to 2D each shows a frame format of a constructional example of an organic field-effect transistor according to the present invention.

The structure shown in FIG. 2A will be used as an example in order to describe the present invention in more detail. As described above, this structure is suitable for an n-type field-effect transistor having an electron as a carrier. As shown in FIG. 2A, the source and drain electrodes 18 are formed over the substrate 16 on which the gate electrode 15 and the insulating layer 12 are formed. The conductive layer 17 is formed over the insulating film 12, the composite layer 13 is stacked thereon, and the source and drain electrodes 18 are formed. Note that, the conductive layer 17 and the composite layer 13 may be formed by using the same mask, and an edge portion of the conductive layer 17 may coincides with an edge portion of the conductive layer 13. And, the semiconductor layer 11 is formed so as to exist at least between the source electrode and the drain electrode. The semiconductor layer 11 is formed so as to partially overlap with the source and drain electrodes 18 in FIG. 2A. The second layer 14 is provided to be in contact with the semiconductor layer 11. In addition, the composite layer 13 is provided between the conductive layer 17 and the second layer 14.

When a voltage is applied to the source electrode having a structure in which the composite layer 13 and the second layer 14 are stacked, holes and electrons are generated at the interface between the composite layer 13 and the second layer 14 due to the carrier separation. Among the generated carriers, the electrons are supplied from the second layer 14 to the semiconductor layer 11, and the holes flow to the conductive layer 17. The electrons discharged from the semiconductor layer 11 to the drain electrode and the holes, which are supplied from the conductive material in the drain electrode, destroy each other at the interface between the second layer 14 and the composite layer 13 in the drain electrode. Thus, current having the electrons as carriers flows inside the semiconductor layer 11.

As described above, providing a stacked layer including the composite layer 13 and the second layer 14 between the semiconductor layer 11 and the conductive layer 17 enables the energy barrier between the semiconductor layer 11 and the source and drain electrodes to be decreased, and enables the supply of electrons from the source electrode to the semiconductor layer and the discharge of the electrons from the semiconductor layer to the drain electrode to become smooth.

In addition, the composite layer 13 is chemically stable, and the adhesiveness of the second layer 14 to the semiconductor layer 11 is favorable as compared with the conductive layer 17. Furthermore, by combining the composite layer 13 with the conductive layer 17, the source and drain electrodes, which can also be used as wirings and has excellent conductivity, can be provided.

As described above, applying the source and drain electrodes of this structure enables an organic field-effect transistor having favorable electron field-effect mobility to be provided. In addition, an organic field-effect transistor having excellent durability can be provided.

In addition, applying this structure enables the energy gap between the source and drain electrodes 18 and the semiconductor layer 11 to be decreased, and therefore, as a material for the conductive layer 17, it is not necessary to select a material having low energy barrier with the semiconductor layer 11. The conductive layer 17 can be selected regardless of the work function thereof, which is also one of the advantages of the present invention.

Note that the items not clearly mentioned in this embodiment mode are compliant with Embodiment Mode 1.

Embodiment Mode 3

Subsequently, a structure in which the organic compound used for the composite layer is also used for the semiconductor layer, will be described. In this structure, the organic compounds used for the composite layer and the semiconductor layer are the same, and therefore a manufacturing process becomes simple and costs can be reduced, which are the advantages. Furthermore, the adhesiveness between the semiconductor layer and the source electrode and between the semiconductor layer and the drain electrode, and the chemical stability of the interface therebetween are increased, and therefore further improvement of the transistor characteristic is expected. Also, the improvement of the durability of the organic field-effect transistor is expected.

A semiconductor material used in the present invention is not especially limited, however an aromatic amine compound is preferable since the material same as the organic compound used for the composite layer, is used.

The structure shown in FIG. 1A will be used as an example in order to describe the present invention in more detail. As shown in FIG. 1A, the source and drain electrodes 18 are formed over the substrate 16 on which the gate electrode 15 and the insulating layer 12 are formed. The conductive layer 17 is formed over the insulating film 12, the composite layer 13 is stacked thereon, and the source and drain electrodes 18 are formed. Note that, the conductive layer 17 and the composite layer 13 may be formed by using the same mask and an edge portion of the conductive layer 17 may coincides with an edge portion of the conductive layer 13, or one edge portion of the conductive layer 17 may coincide with one edge portion of the composite layer 13 as shown in FIG. 1A. However, an organic compound used for the composite layer 13 is the same as an organic semiconductor material for the semiconductor layer 11 to be formed next. Next, the semiconductor layer 11 is formed so as to exist at least between the source electrode and the drain electrode. In this case, the composite layer 13 is provided to be in contact with the semiconductor layer 11.

By applying the source and drain electrodes having the structure in which the composite layer 13 is inserted between the semiconductor layer 11 and the conductive layer 17, as described in Embodiment Mode 1, the energy barrier between the semiconductor layer 11 and the source and drain electrodes 18 is decreased, and the injection of carriers from the source electrode to the organic semiconductor layer and the discharge of carriers from the semiconductor layer to the drain electrode become smooth. Also, by conforming the organic compound used for the composite layer 13 with the organic semiconductor material used for the semiconductor layer 11, the adhesiveness between the semiconductor layer 11 and the source electrode 18 and between the semiconductor layer 11 and drain electrode 18 and the chemical stability of the interface therebetween are improved. Therefore, a structure in which an effect to decrease the energy barrier between the semiconductor layer 11 and the conductive layer 17 becomes further effective by the composite layer 13, can be obtained. In addition, durability of the transistor is improved.

When the structure of this embodiment mode is applied to the structure of Embodiment Mode 2, the material used for the organic semiconductor layer may be used as the organic compound of the second layer. Other structures are the same as Embodiment Mode 2.

Embodiment Mode 4

In this embodiment mode, the structure in which edge portions of conductive layers 17 facing to the carrier flow direction in the semiconductor layer 11 are covered with composite layers 13 is explained. That is, edge portions of conductive layers 17 opposing to each other are covered with the composite layers 13. As for structures shown in FIGS. 3A to 3D, only the above described part is different from Embodiment Mode 1, and the other part which is not described in this embodiment mode is compliant with Embodiment Mode 1. Note that structure except for the composite layer in FIGS. 3A to 3D correspond to that in FIGS. 1A to 1D, respectively, and therefore, detailed explanation is omitted here.

As for an organic field-effect transistor, an alignment direction affects the ease of current flow in some cases, depending on an organic material used as a semiconductor layer. Therefore, the consideration to uniform the alignment is normally given so that the current flows more easily to the direction of carriers flowing in a portion where a channel is formed.

As previously mentioned, this embodiment mode has the structure in which the edge portion of the conductive layer 17 opposing to the carrier flow direction in the semiconductor layer 11 of the organic field-effect transistor shown in Embodiment Mode 1, is covered with the composite layer 13. With such a structure, carriers can be injected more smoothly to the direction of the current flow, and the characteristic of the organic field-effect transistor can be improved.

The structure described above is suitable for a p-type organic filed-effect transistor, and as a structure which is suitable for an n-type organic field-effect transistor, FIGS. 4A to 4D can be given. FIGS. 4A to 4D correspond to FIGS. 2A to 2D respectively, and the parts of the structure shown in FIGS. 4A to 4D which are not described in this embodiment mode are compliant with Embodiment Mode 2.

In the structure of FIGS. 4A to 4D, edges opposing to the direction of the carrier flow in the conductive layer 17 or the semiconductor layer 11 of the organic field-effect transistor as shown in Embodiment Mode 2, are covered with the composite layer, and edges opposing to the direction of the carrier flow in the composite layer 13 are covered with the second layer 14, as shown in Embodiment Mode 2. With such a structure, carriers can be injected more smoothly to the direction of the current flow, and the characteristic of the organic field-effect transistor can be improved.

Embodiment Mode 5

A method for manufacturing the organic field-effect transistor of the present invention shown in FIG. 1A will be described with reference to FIG. 5A to 5E. First, description is given using a p-type organic field-effect transistor as an example. A gate electrode 15 made from tungsten is formed on a substrate 16 to have a thickness of 100 nm, an insulating layer 12 made from silicon dioxide ($SiO_2$) is formed thereon to have a thickness of 100 nm as a gate insulating film, and conductive layer 17 made from tungsten are formed thereon to have a thickness of 100 nm. After forming a tungsten film on the entire surface of the substrate by a sputtering method or the like, a mask is formed using photolithography and etching is performed to form a desired shape, thus the gate electrode 15 is formed. Either wet etching or dry etching may be used. The insulating layer 12 is formed by a CVD method or the like. The conductive layer 17 is formed in the same manner as the gate electrode. Then, over the conductive layer 17, composite layer 13 is formed by co-evaporating molybdenum oxide (VI) and NPB, which is an aromatic amine compound, using a mask, by vacuum evaporation using resistance heating, such that a molybdenum oxide-NPB molar ratio is 1:1. The thickness of the composite layer 13 is 10 nm. Thus, source and drain electrodes formed of the conductive layer 17 and the composite layer 13 are formed. After that, as a semiconductor layer 11, a pentacene film is formed by evaporation at least between the source electrode and drain electrode to manufacture the organic field-effect transistor. The semiconductor layer 11 may be evaporated using a mask.

A manufacturing method of FIGS. 1B to 1D are basically similar to the manufacturing method described above, except that the manufacturing order is changed. However, in a case of forming the conductive layer 17 in FIGS. 1B and 1D, the conductive materials are preferably formed by vacuum evaporating gold using a mask, since electrodes are to be formed on the semiconductor layer 11.

When a drain current at the time of applying gate voltage to the manufactured organic field-effect transistor is measured to obtain the electron field-effect mobility, an excellent transistor characteristic of the p-type can be obtained. As compared with an organic field-effect transistor in which a composite layer is not used as a part of source and drain electrodes, a better transistor characteristic can be obtained.

In a case of manufacturing an organic field-effect transistor in which edge portions of conductive layers opposing to the carrier flow direction in a semiconductor layer are covered with a composite layer, the organic field-effect transistor can be manufactured by changing a shape of a mask which manufactures the composite layer.

Embodiment Mode 6

A method for manufacturing the n-type organic field-effect transistor as shown in FIG. 2A, will be described using FIGS. 6A to 6F as examples. A gate electrode 15 made from tungsten is formed on a substrate 16 to have a thickness of 100 nm, an insulating layer 12 made from silicon dioxide is formed thereon to have a thickness of 100 nm as a gate insulating film, and conductive layer 17 made from tungsten are formed thereon to have a thickness of 100 nm. After forming a tungsten film by a sputtering method or the like, a mask is formed using photolithography, and the tungsten film is etched to form the gate electrode 15, and the conductive layer 17 to have desired shapes. Either wet etching or dry etching may be used. The insulating layer may be formed by a CVD method or the like. Then, over the conductive layer 17, composite layer 13 is formed with a thickness of 10 nm by coevaporating molybdenum oxide (VI) and NPB, using a mask, by vacuum evaporation using resistance heating, such that a molar ratio between molybdenum oxide and NPB is 1:1. Further, a lithium metal and BCP which is an organic compound are coevaporated such that a molar ratio between lithium metal and BCP is 1:1 in the same way to form a second layer 14 with a thickness of 10 nm. Thus source and drain electrodes including the conductive layer 17, the composite layer 13, and the second layer 14 are formed. After that, as a semiconductor layer 11, perylenetetracarboxydiimie is formed by vacuum evaporation using a mask between the source electrode and the drain electrode to manufacture the organic field-effect transistor.

Figure 2B:
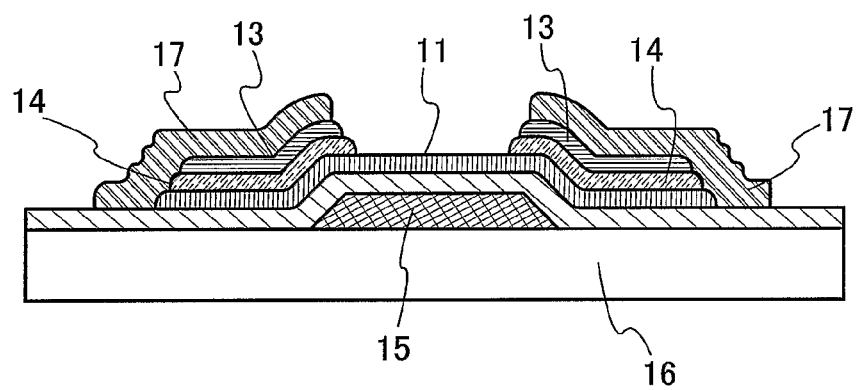
Figure 2C:
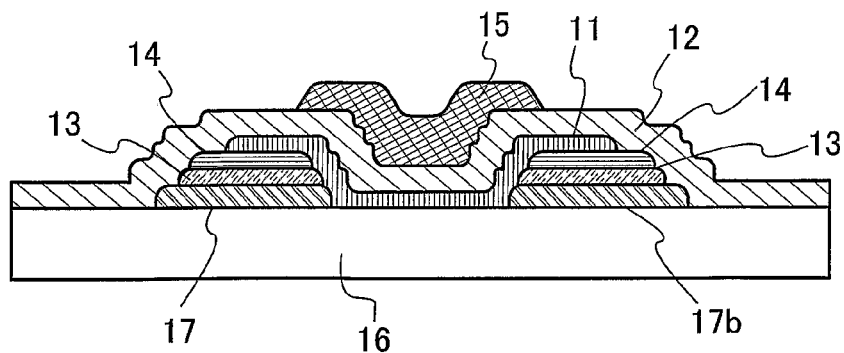
Figure 2D:
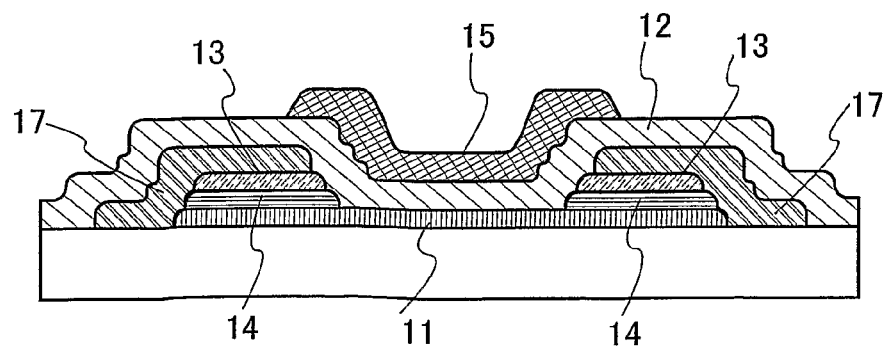
Figure 3A:
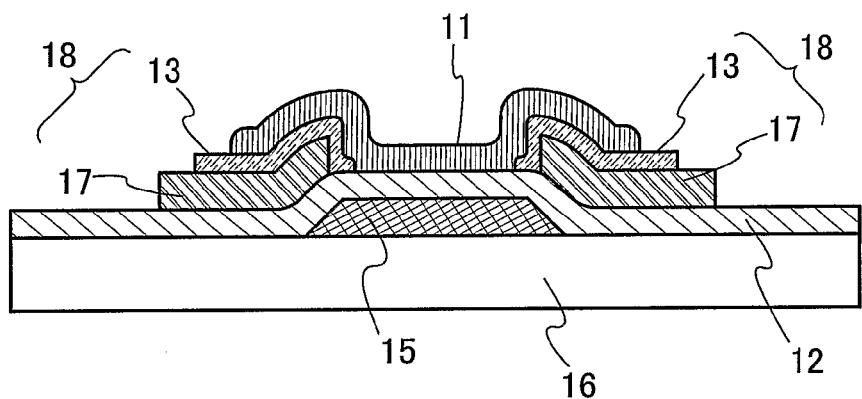
FIGS. 3A to 3D each shows a frame format of a constructional example of an organic field-effect transistor according to the present invention.
Figure 3B:
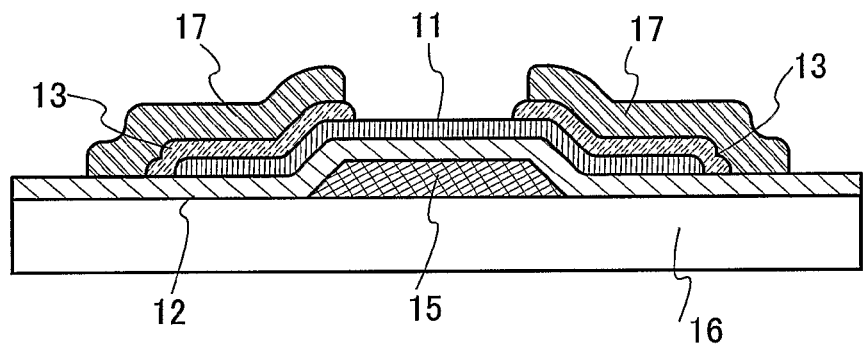
Figure 3C:
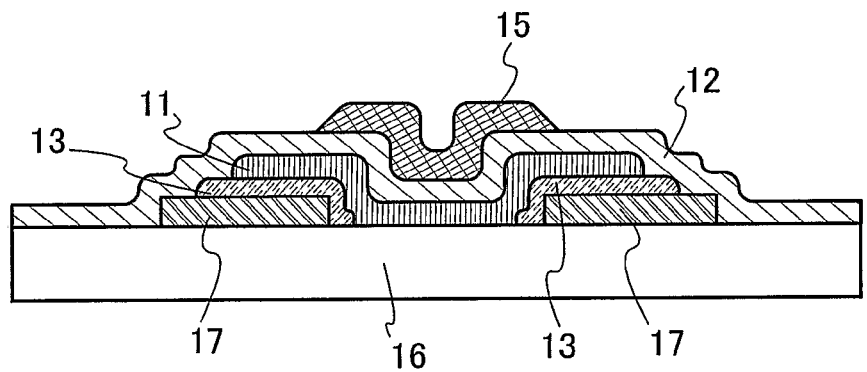
Figure 3D:
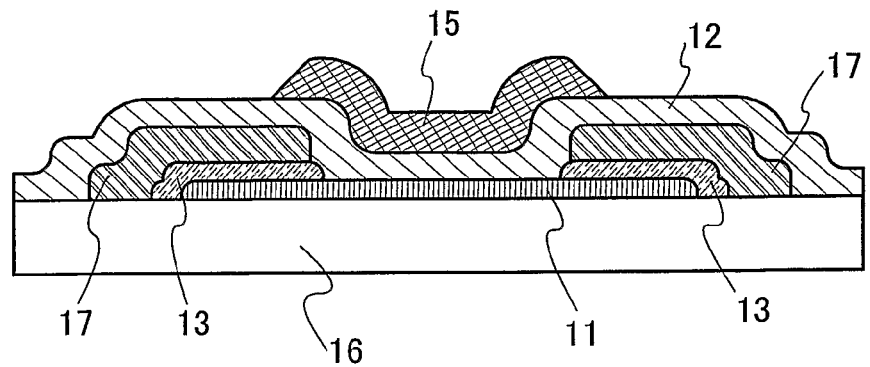
Figure 4A:
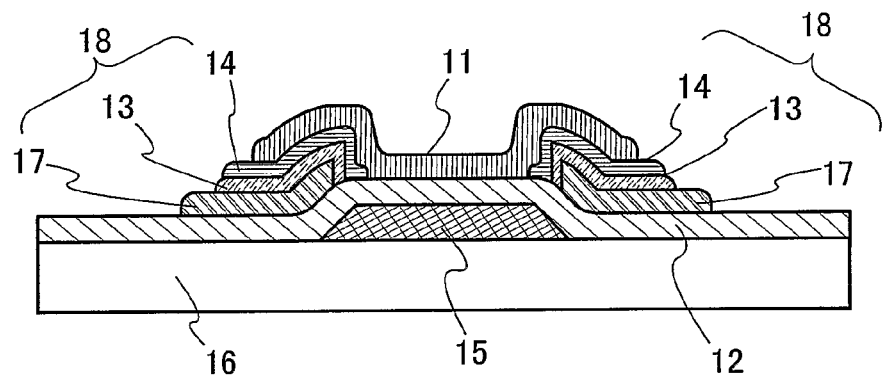
FIGS. 4A to 4D each shows a frame format of a constructional example of an organic field-effect transistor according to the present invention.
Figure 4B:
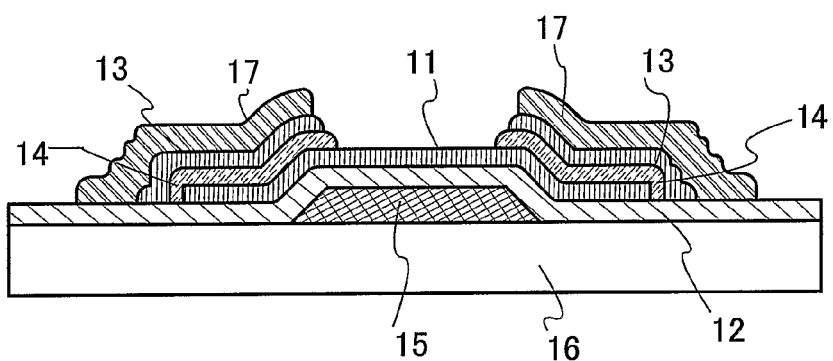
Figure 4C:
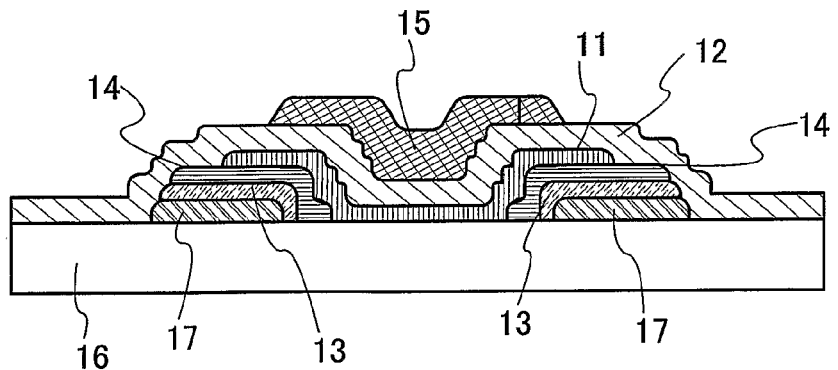
Figure 4D:
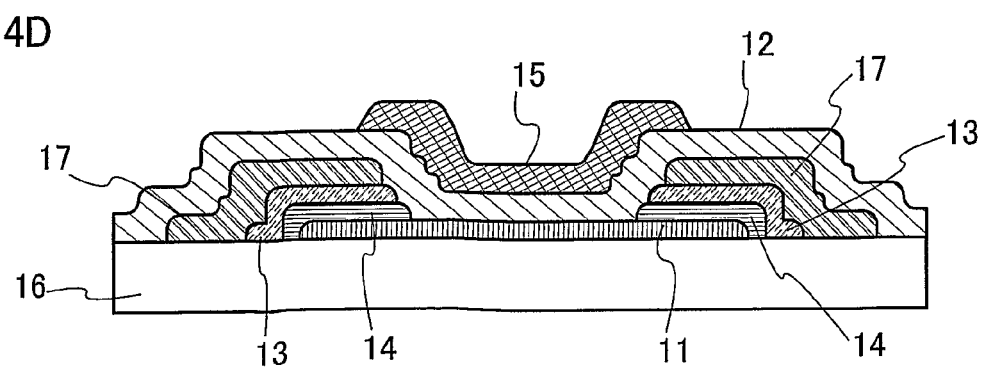
Figure 5A:
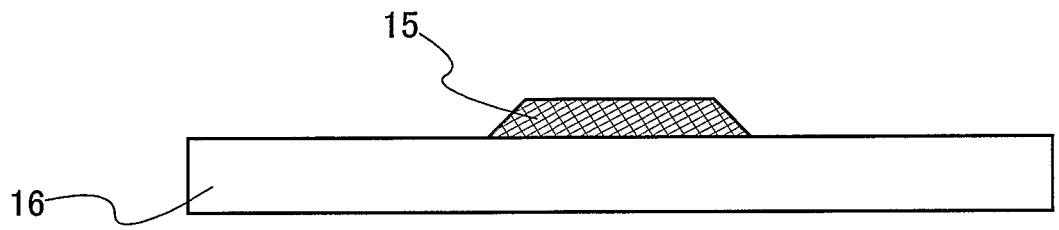
FIGS. 5A to 5E each shows a manufacturing method of an organic field-effect transistor according to the present invention.
Figure 5B:
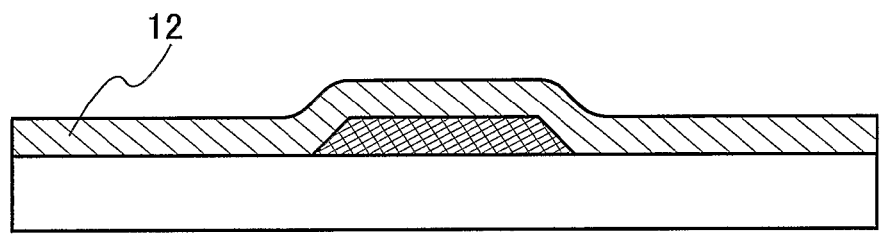
Figure 5C:
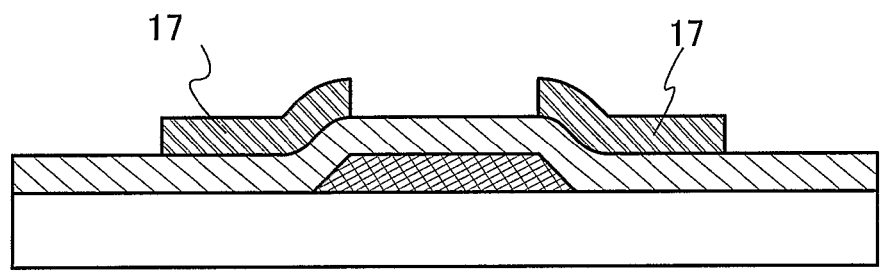
Figure 5D:
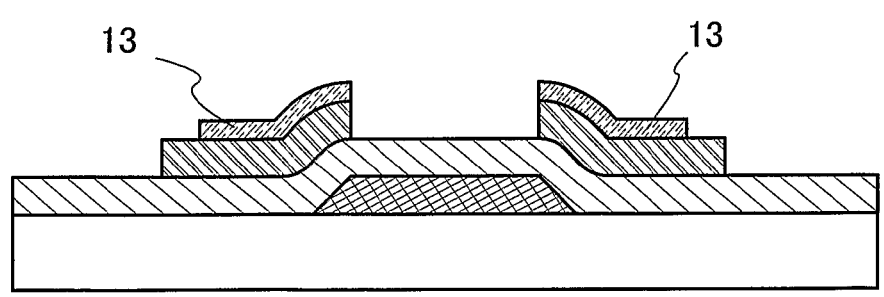
Figure 5E:
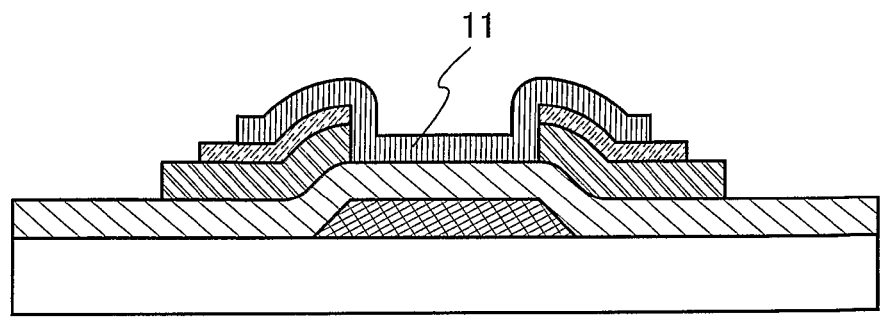
Figure 6A:
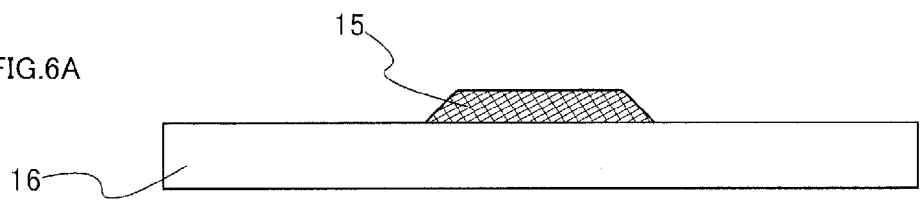
FIGS. 6A to 6F each shows a manufacturing method of an organic field-effect transistor according to the present invention.
Figure 6B:
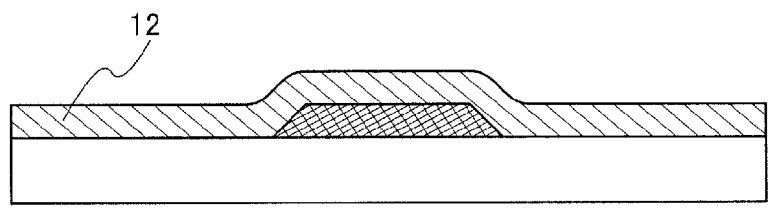
Figure 6C:
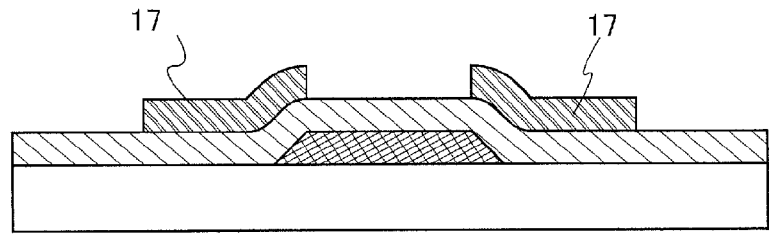
Figure 6D:
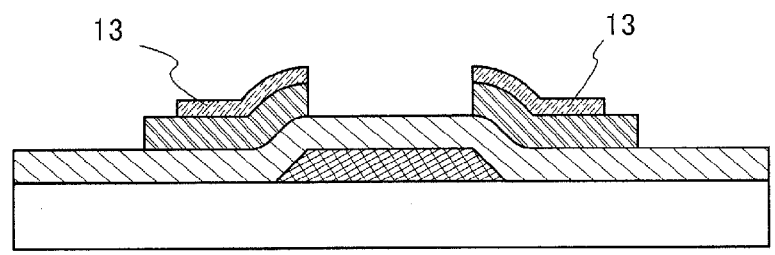
Figure 6E:
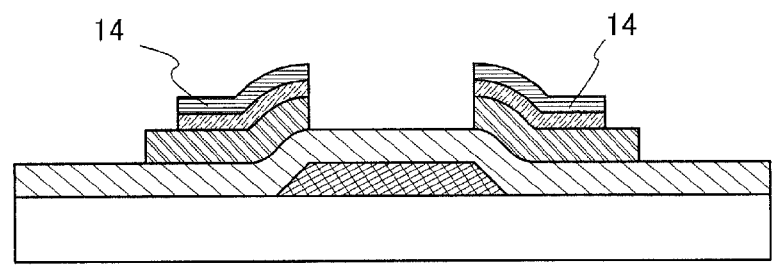
Figure 6F:
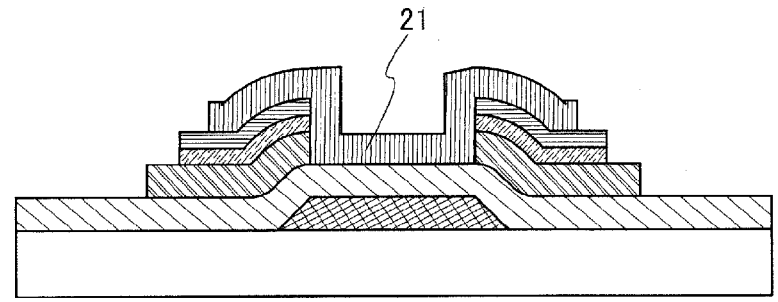

A manufacturing method of FIGS. 2B to 2D are basically similar to the manufacturing method described above, except that the manufacturing order is changed. However, in a case of forming conductive layer 17 in FIGS. 2B and 2D, the conductive layer is formed by evaporating a gold using a mask by vacuum heating, since electrodes are to be formed on the semiconductor layer 11.

When a drain current at the time of applying gate voltage to the manufactured organic field-effect transistor is measured to obtain the electron field-effect mobility, an excellent transistor characteristic of the n-type can be obtained. As compared with an organic field-effect transistor in which a composite layer or a second layer is not used as a part of source and drain electrodes, a better transistor characteristic can be obtained.

In a case of manufacturing an organic field-effect transistor in which edge portions opposing to the carrier flow direction in a semiconductor layer are covered with a composite layer, the organic field-effect transistor can be manufactured by changing a shape of a mask which manufactures the composite layer and the second layer.

Embodiment Mode 7

A manufacturing method of an organic field-effect transistor in which an organic compound used for a composite layer is the same as an organic semiconductor material used for a semiconductor layer, will be described below, with reference to FIGS. 5A to 5E. A gate electrode 15 made from tungsten is formed on a substrate 16 to have a thickness of 100 nm, an insulating layer 12 made from silicon dioxide ($SiO_2$) is formed thereon to have a thickness of 100 nm as an insulating film, and conductive materials 17a and 17b made of tungsten are formed thereon to have a thickness of 100 nm. Then, on the conductive layer 17, as composite layer 13, molybdenum oxide (VI) and TPD which is an aromatic amine compound, are co-evaporated with a thickness of 10 nm such that a molar ratio between molybdenum oxide and TPD is 1:1. Thus source and drain electrodes including the conductive layer 17 and the composite layer 13 are formed. After that, as a semiconductor layer 11, a TPD film is formed by evaporation between the source electrode and the drain electrode to manufacture the organic field-effect transistor. An organic compound used for a semiconductor material and a composite layer may be any of the materials of the semiconductor layer described in Embodiment Mode 1. For example, in a case of forming a semiconductor layer 11 using pentacene, pentacene is used for an organic compound which is used for a composite layer.

As for the organic field-effect transistor having such a structure in this embodiment mode, since the material for the semiconductor layer 11 and the organic compound material used for the composite layer 13 are the same, the adhesiveness between the composite layer 13 and the semiconductor layer 11 is further improved, and the generation of defects due to the peeling occurred between the semiconductor layer and the source electrode or the drain electrode can be efficiently reduced.

Note that the description of a manufacturing method is omitted since it is the same as Embodiment Mode 1.

When a drain current at the time of applying gate voltage to the manufactured organic field-effect transistor is measured to obtain the electron field-effect mobility, an excellent transistor characteristic of the p-type can be obtained. As compared with an organic field-effect transistor in which a composite layer is not used as a part of source and drain electrodes, a better transistor characteristic can be obtained.

In a case of manufacturing an organic field-effect transistor in which edges opposing to the direction of the carrier flow in a conductive material or a semiconductor layer are covered with a composite layer, the organic field-effect transistor can be manufactured by changing a shape of a mask which manufactures the composite layer.

Embodiment Mode 8

A liquid crystal device, in which the organic field-effect transistor of the present invention is used, will be described with reference to FIG. 7 and FIGS. 8A and 8B.

Figure 7:
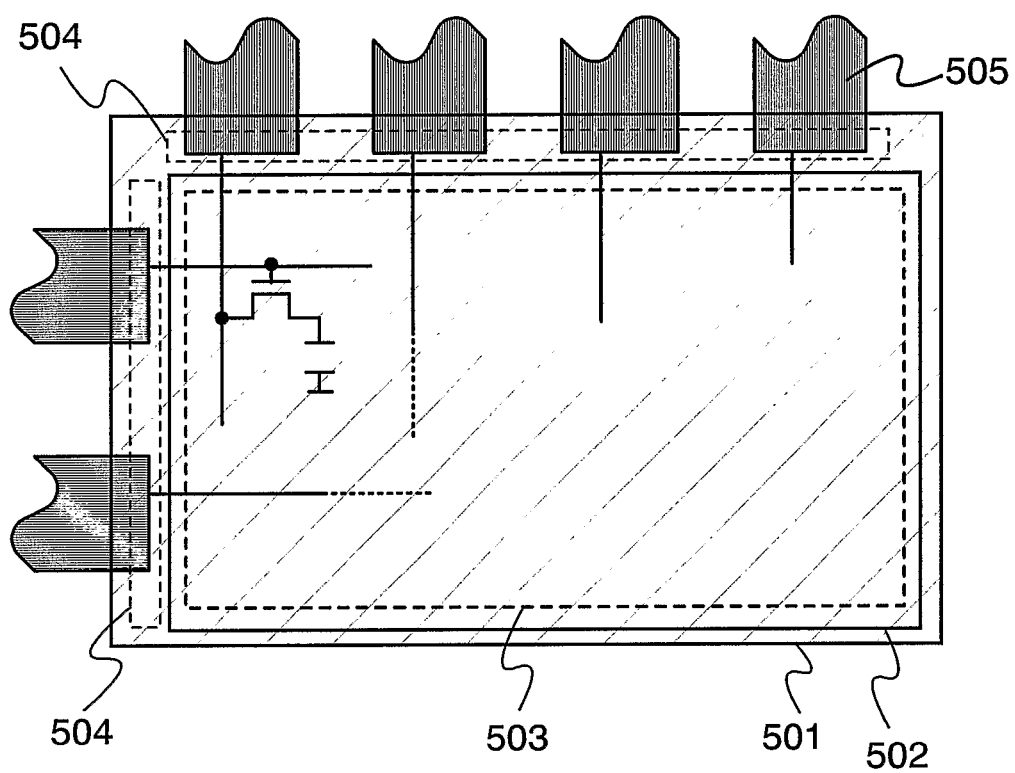
FIG. 7 shows a frame format of a top view of a liquid crystal display device using the present invention.

FIG. 7 shows a frame format of a top view of a liquid crystal device. In the liquid crystal device of this embodiment mode, an element substrate 501 and a counter substrate 502 are attached to each other, and a pixel portion 503 formed on the element substrate 501 is sealed with the counter substrate and a sealing material. A flexible printed circuit (FPC) 505 is connected to an external connection portion 504 provided in the periphery of the pixel portion 503, and a signal from an external portion is inputted. In addition, a driver circuit and the flexible printed circuit may be individually provided like this embodiment mode, or they may be provided by composing a TCP, etc. in which an IC chip is mounted on the FPC provided with a wiring pattern.

Figure 8A:
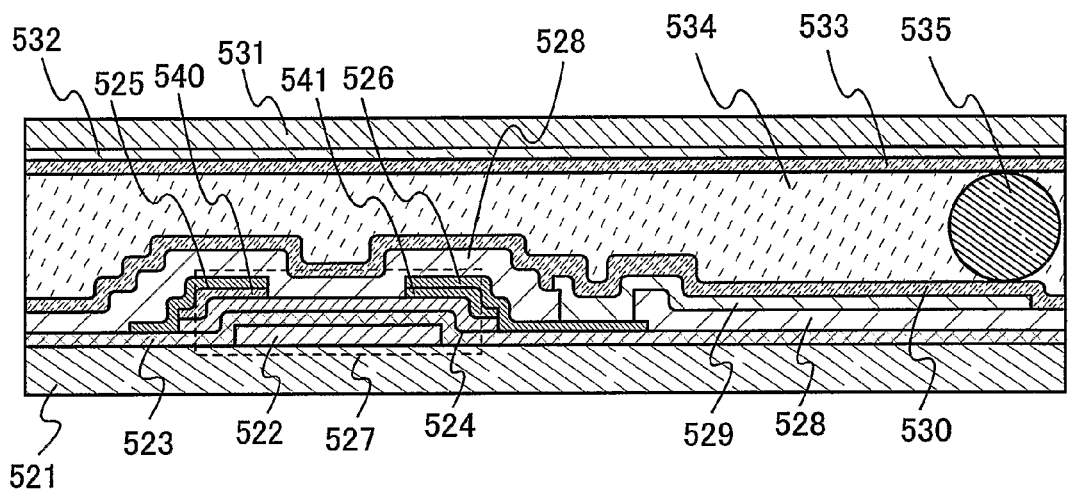
FIGS. 8A and 8B each shows a frame format of a cross-sectional view of a liquid crystal display device using the present invention.
Figure 8B:
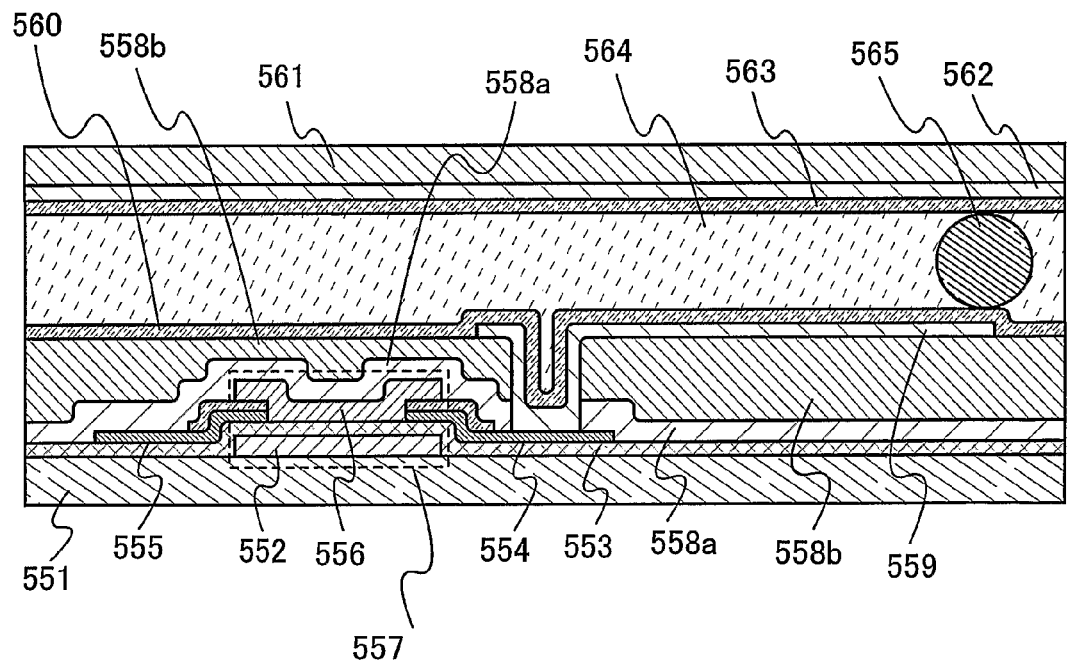

There is not a specific limit on the pixel portion 503, for example, like a cross-sectional view in FIG. 8A or 8B, the pixel portion has a liquid crystal element and a transistor for driving the liquid crystal element.

The liquid crystal device shown by the cross-sectional view of FIG. 8A has a gate electrode formed over a substrate 521, a gate insulating film 523 formed over the gate insulating film 523, a semiconductor layer 524 formed over the gate insulating film 523, composite layers 540 and 541 functioning as a source electrode or a drain electrode formed over the semiconductor layer 524, as well as the semiconductor device of Embodiment Mode 3. Here, providing the composite layers 540 and 541 as a source electrode or a drain electrode makes it possible to transport carriers between the semiconductor layer 524 and the source electrode or the drain electrode smoothly. In addition, since the conductive layers 525 and 526 may be selected regardless of their work functions, there is a wide range of choices in selecting a material.

A pixel element includes a liquid crystal layer 534 sandwiched between a pixel electrode 529 and a counter electrode 532. Alignment films 530 and 533 are provided on the surfaces of the pixel electrode 529 and the counter electrode 532 respectively, and the alignment films 530 and 533 are in contact with the liquid crystal layer 534. A spacer 535 is dispersed in the liquid crystal layer 534, and it keeps a cell gap. The transistor 527 is covered with an insulating layer 528 in which a contact hole is provided, and an electrode formed of the conductive material 526 and the pixel electrode 529 are electrically connected to each other. Here, the counter electrode 532 is supported by a counter substrate 531. In addition, in the transistor 527, a gate insulating layer 523 is sandwiched between the semiconductor layer 524 and a gate electrode 522, and the semiconductor layer 524 and the gate electrode 522 are partially overlapped.

The liquid crystal device shown by the cross-sectional view in FIG. 8B has an element substrate 551 including a transistor 557 in which at least a part of an electrode (including conductive layers 554 and 555 and composite layers 570 and 571) functioning as a source electrode or a drain electrode is covered with a semiconductor layer 556.

Here, providing the composite layers 570 and 571 as a source electrode or a drain electrode makes it possible to transport carriers between the semiconductor layer 556 and the source electrode or the drain electrode smoothly. In addition, since the conductive materials 554 and 555 may be selected regardless of their work functions, there is a wide range of choices in selecting a material.

A liquid crystal element includes a liquid crystal layer 564 sandwiched between a pixel electrode 559 and a counter electrode 562. Alignment films 560 and 563 are provided on the surfaces of the pixel electrode 559 and the counter electrode 562 respectively, and the alignment films 560 and 563 are in contact with the liquid crystal layer 564. A spacer 565 is dispersed in the liquid crystal layer 564, and it keeps a cell gap. The transistor 557 over the substrate 551 is covered with insulating layers 558*a* and 558*b* in which a contact hole is provided, and an electrode including the conductive layer 554 and the pixel electrode 559 are electrically connected to each other. Note that an insulating layer covering the transistor may be a multiple layer of the insulating layer 558*a* and the insulating layer 558*b* as shown in FIG. 8B, or a single layer formed of the insulating layer 528 as shown in FIG. 8A. In addition, the insulating layer covering the transistor may be a layer having a planarized surface like the insulating layer 558*b* in FIG. 8B. Here, the counter electrode 562 is supported by a counter substrate 561. In addition, in the transistor 557, a gate insulating layer 553 is sandwiched between the semiconductor layer 556 and a gate electrode 552, and the semiconductor layer 556 and the gate electrode 552 are partially overlapped.

A structure of the liquid crystal device is not especially limited, and for example, it may be a structure in which a driver circuit is provided on an element substrate, in addition to the mode shown in this embodiment mode.

Subsequently, a light-emitting device in which the organic field-effect transistor of the present invention is used, will be described with reference to FIGS. 9A and 9B. A light-emitting element 617 forming a pixel portion of the light-emitting device is formed by sandwiching a light-emitting layer 616 between a pixel electrode 609 and a common electrode 611. The pixel electrode 609 is electrically connected to a conductive layer 607, which is a part of an electrode of an organic field-effect transistor 615, through a contact hole provided at an interlayer insulating film 608 covering the organic field-effect transistor 615. The electrode of the organic field-effect transistor includes a stacked layer of a composite layer 604 and a conductive material 606 and a stacked layer of a composite layer 605 and the conductive layer 607. A semiconductor layer 603 is provided using the material described in Embodiment Mode 1, such as pentacene, and the semiconductor layer 603 is partially overlapped with a gate electrode 601 through a gate insulating film 602. The gate electrode 601 is formed on a substrate 600, and the gate electrode 601 and source and drain electrodes of the organic field-effect transistor 615 are partially overlapped with each other through the gate insulating film 602 and the semiconductor layer 603. Edges of the gate electrode 609 are covered with an insulating layer 610, and the light-emitting layer 616 is formed so as to cover the portion which is not covered with the insulating layer 610. Note that a passivation film 612 is formed covering the common electrode 611, however the passivation film is not necessarily formed. The substrate 600 over which these elements are formed, is sealed with a counter substrate 614 at the outer side of the pixel portion, using a sealing material which is not shown in the drawing, and a light-emitting element 617 is kept from air. A space 613 between the counter substrate 614 and the substrate 600 may be filled with an inert gas such as dried nitrogen, or sealing may be carried out by filling a resin or the like in the space 613, instead of the sealing material.

Figure 9A:
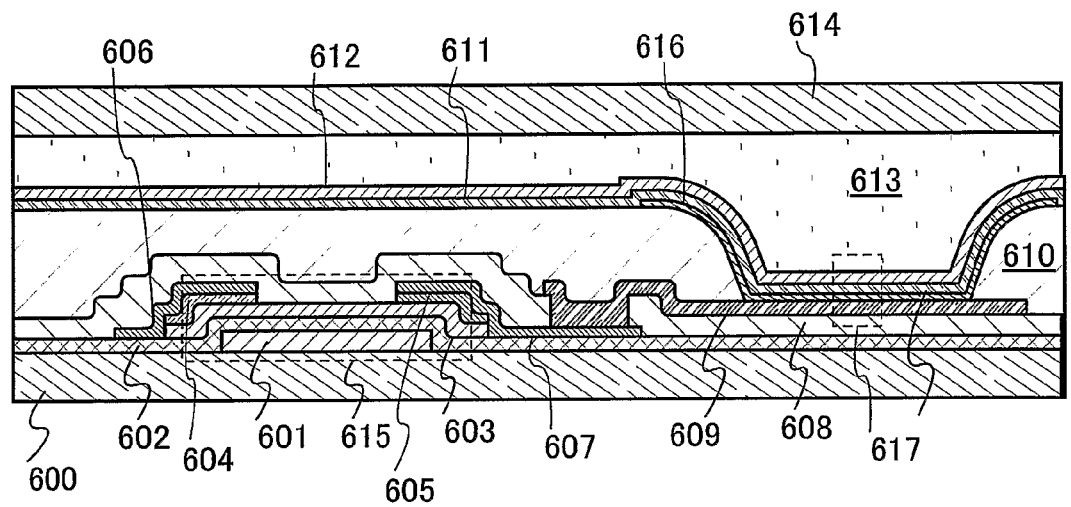
FIGS. 9A and 9B each shows a frame format of a cross-sectional view of a light-emitting display device using the present invention.
Figure 9B:
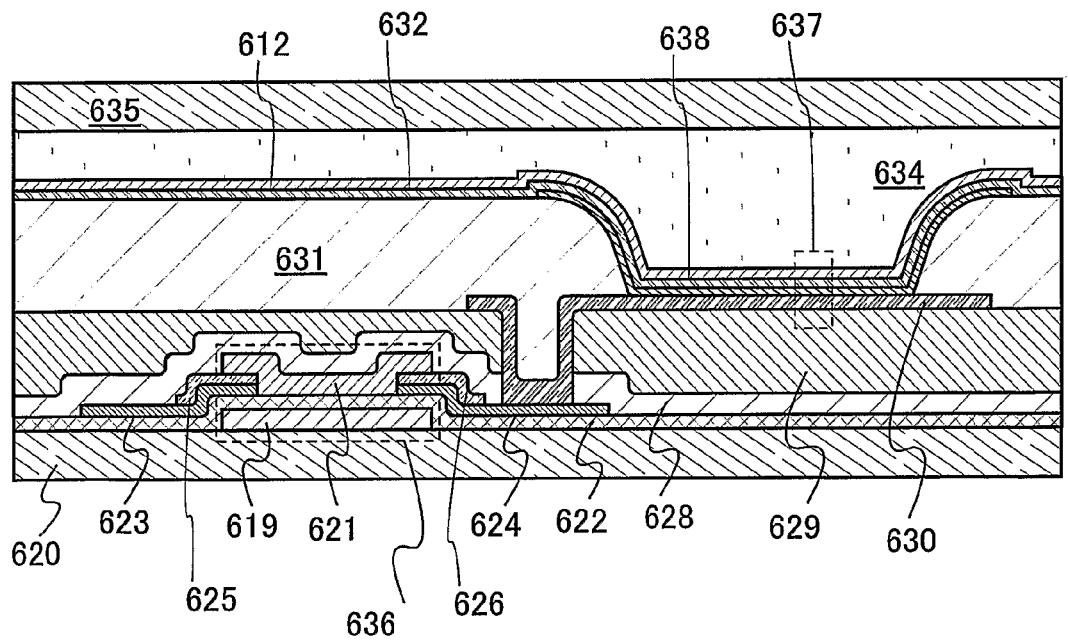

FIG. 9B is a structure of a light-emitting device which is different from that of FIG. 9A. A light-emitting element 637 forming a pixel portion of the light-emitting device is formed by sandwiching a light-emitting layer 638 between a pixel electrode 630 and a common electrode 632. The pixel electrode 630 is electrically connected to a conductive layer 624, which is a part of an electrode of an organic field-effect transistor 636, through a contact hole provided at a first interlayer insulating film 628 and a second interlayer insulating film 629 formed by covering the organic field-effect transistor 636. The electrode of the organic field-effect transistor 636 includes a stacked layer of a composite layer 625 and a conductive layer 623 and a stacked layer of a composite layer 626 and the conductive layer 624. A semiconductor layer 621 is provided using the material described in Embodiment Mode 1, such as pentacene, and the semiconductor layer 621 is partially overlapped with a gate electrode 619 through a gate insulating film 622. The gate electrode 619 is formed on a substrate 620, and the gate electrode 619 and source and drain electrodes of the organic field-effect transistor 636 are partially overlapped with each other through the gate insulating film 622. Edges of the pixel electrode 630 are covered with an insulating layer 631, and the light-emitting layer 638 is formed so as to cover the portion which is not covered with the insulating layer 631. Note that a passivation film 612 is formed covering the common electrode 632, however the passivation film 612 is not necessarily formed. The substrate 620 over which these elements are formed, is sealed with a counter substrate 635 at the outer side of the pixel portion, using a sealing material which is not shown in the drawing, and a light emitting element 637 is kept from air. A space 634 between the counter substrate 635 and the substrate 620 may be filled with an inert gas such as dried nitrogen, or sealing may be carried out by filling a resin or the like in the space 634, instead of the sealing material.

Figure 10A:
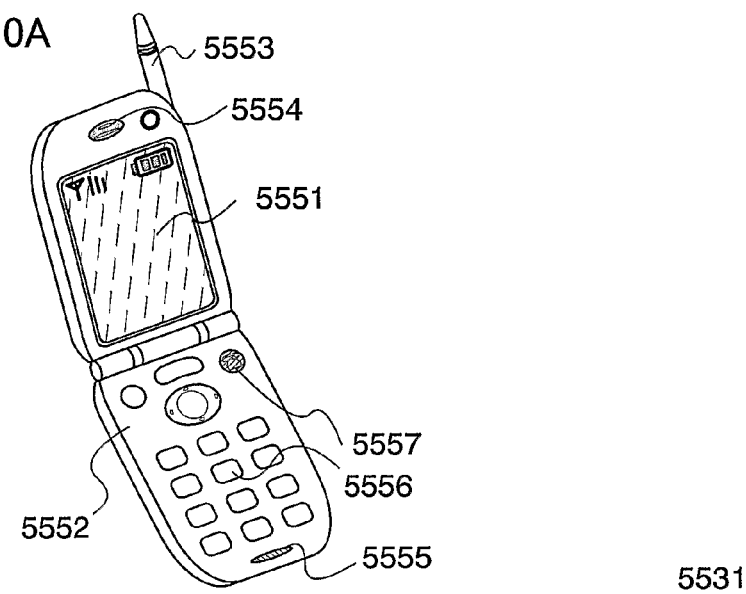
FIGS. 10A to 10C each shows an electronic device using the present invention.
Figure 10B:
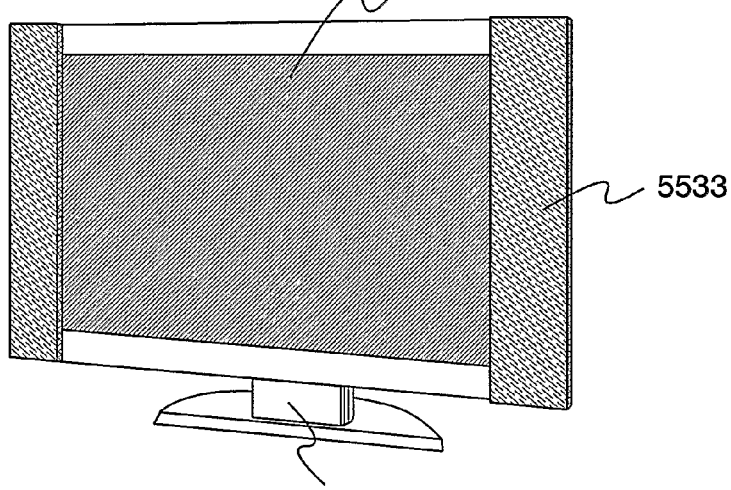
Figure 10C:
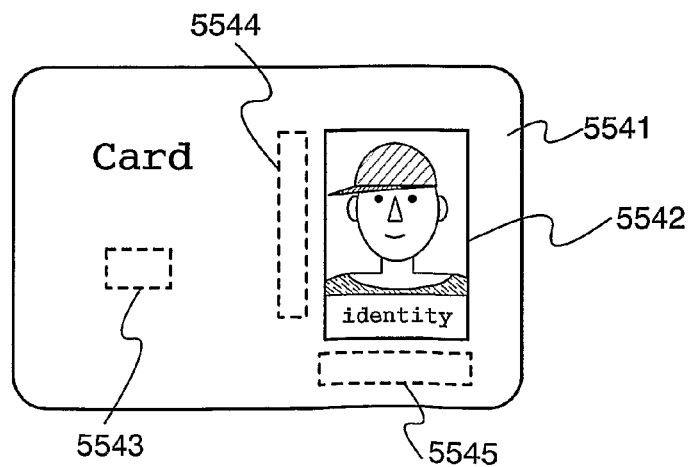

The display device described above can be used as a display device implemented in a telephone set or a television image receiving device and the like, as shown in FIGS. 10A to 10C. In addition, the display device may be implemented in a card and the like having a function to manage personal information like an ID card.

FIG. 10 shows a telephone set, which includes a main body 5552 including a display portion 5551, a voice output portion 5554, a voice input portion 5555, operation switches 5556 and 5557, an antenna 5553 and the like. This telephone set has good operation characteristic and high reliability. The telephone set like this can be completed by implementing the semiconductor device of the present invention in the display portion.

FIG. 10B is a television image receiving device manufactured by applying the present invention, which includes a display portion 5531, a housing 5532, a speaker 5533 and the like. This television image receiving device has good operation characteristic and high reliability. The television image receiving device like this can be completed by implementing the light-emitting device having the light-emitting element of the present invention as the display portion.

FIG. 10C is an ID card manufactured by applying the present invention, which includes a base 5541, a display portion 5542, an integrated circuit chip 5543 implemented in the base 5541, and the like. In addition, integrated circuits 5544 and 5545 for driving the display portion 5542 are also implemented in the base 5541. This ID card has high reliability. For example, information inputted to or outputted from the integrated circuit chip 5543 is displayed in the display portion 5542, and the inputted information can be verified in the display portion 5542.

Embodiment 1

A manufacturing example of the p-type organic field-effect transistor described in Embodiment Mode 1 will be described specifically in this Embodiment. The manufactured transistor has a bottom gate type and a top contact type structure as shown in FIG. 1B. Note that FIG. 1B is hereinafter used.

First, a tungsten film was formed over a quartz substrate 16 to have a thickness of 100 nm by a sputtering method, and thus a gate electrode 15 was formed. Then, a silicon oxynitride film was formed to have a thickness of 100 nm by a CVD method, and further a polyimide alignment film was formed to have a thickness of 40 nm by a spin coating method, and thus an insulating layer 12 (a gate insulating film) was formed. Note that the polyimide alignment film has an effect to increase wettability of a semiconductor layer 11.

Subsequently, over the insulating layer 12, a pentacene film was formed to have a thickness of 50 nm as the semiconductor layer 11 by a vacuum evaporation method. After that, DNTPD and molybdenum trioxide were coevaporated through a metal mask having an opening portion, and thus composite layers 13a and 13b were formed. Furthermore, an aluminum film was formed to have a thickness of 100 nm as conductive materials 17a and 17b by vacuum evaporation using resistance heating through the same metal mask. Note that a ratio between DNTPD and molybdenum was adjusted so as to be 2:1 (=DNTPD: molybdenum trioxide) in mass ratio. In addition, both a channel length L and a channel width W of the transistor were adjusted so as to be 200 μm.

Note that the above described composite layers and the conductive materials function as a source and drain electrodes in this embodiment.

Figure 11:
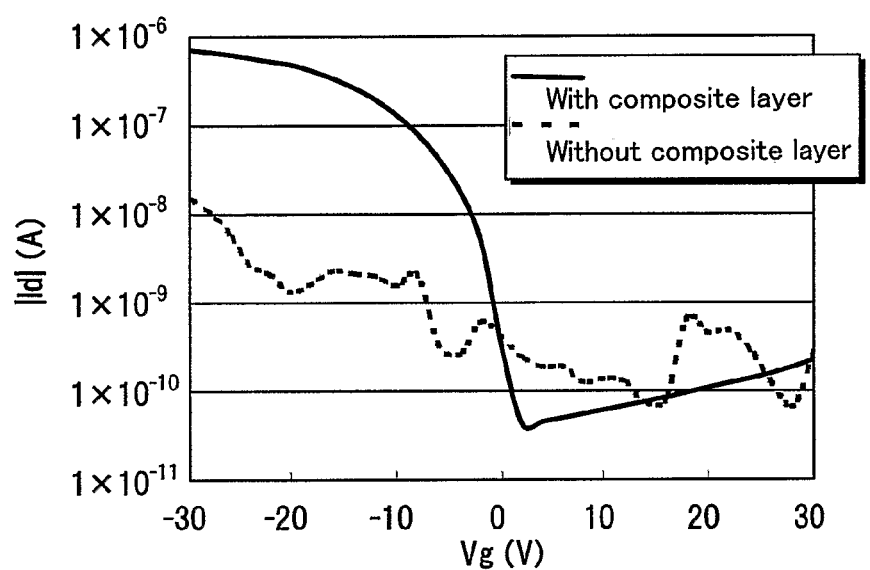
FIG. 11 shows the Vg-Id characteristic of an organic field-effect transistor according to the present invention.

As for the p-type organic field-effect transistor manufactured as described above, a gate voltage (Vg)-drain current (Id) characteristic when a voltage of −10V was applied, was measured as a drain voltage (Vg). The result thereof is shown by a heavy line in FIG. 11. As shown in FIG. 11, a large ON-OFF ratio (ratio between ON current and OFF current) and favorable transistor characteristic are shown.

COMPARATIVE EXAMPLE

For comparison, a transistor having a similar structure to that of the above embodiment, except that the composite layers 13a and 13b were removed from the structure of the above embodiment mode, was manufactured. In other words, the transistor of the comparative example has a structure in which aluminum was directly in contact with a semiconductor layer 11 as source and drain electrodes.

As for the transistor of the comparative example, a gate voltage (Vg)-drain current (Id) characteristic when a voltage of −10V was applied, was measured as a drain voltage (Vg). The result thereof is shown by an undulating line in FIG. 11. As shown in FIG. 11, the transistor of the comparative example, which does not have a composite layer has a small ON-OFF ratio, and did not function as a transistor.

EXPLANATION OF REFERENCE

11: semiconductor layer, 12: insulating layer, 13: composite layer, 14: second layer, 15: gate electrode, 16: substrate, 17: conductive layer, 18: source electrode, 18: drain electrode, 501: element substrate, 502: counter substrate, 503: pixel portion, 504: external connection portion, 521: element substrate, 522: gate electrode, 523: gate insulating layer, 524: semiconductor layer, 525: conductive material, 526 conductive material, 527: transistor, 528: insulating layer, 529: pixel electrode, 530: alignment film, 531: counter substrate, 532: counter electrode, 533: alignment film, 534: liquid crystal layer, 535: spacer, 540: composite layer, 541: composite layer, 551: element substrate, 552: gate electrode, 553: gate insulating layer, 554: conductive material, 555: conductive material, 556: semiconductor layer, 557: transistor, 558a: insulating layer, 558b: insulating layer, 559: pixel electrode, 560: alignment film, 561: counter substrate, 562: counter electrode, 563: alignment film, 564: liquid crystal layer, 565: spacer, 570: composite layer, 571: composite layer, 600: substrate, 601: gate electrode, 602: gate insulating film, 603: semiconductor layer, 604: composite layer, 605: composite layer, 606: conductive material, 607: conductive material, 608: interlayer insulating film, 609: pixel electrode, 610: insulating layer, 611: common electrode, 612: passivation film, 613: space, 614: counter substrate, 615: organic field-effect transistor, 616: light-emitting layer, 617: light-emitting element, 619: gate electrode, 620: substrate, 621: semiconductor layer, 622: gate insulating film, 623: conductive material, 624: conductive material, 625: composite layer, 626: composite layer, 628: first interlayer insulating film, 629: second interlayer insulating film, 630: pixel electrode, 631: insulating layer, 632: common electrode, 634: space, 635: counter substrate, 636: organic field-effect transistor, 637: light-emitting element, 638: light-emitting layer, 5531: display portion, 5532: housing, 5533: speaker, 5541: base, 5542: display portion, 5543: integrate circuit chip, 5544: integrated circuit, 5545: integrated circuit, 5551: display portion, 5552: main body, 5553: antenna, 5554: voice output terminal, 5555: voice input terminal, 5556: operation switch, 5557: operation switch

The invention claimed is:
1. A semiconductor device comprising:
an organic field-effect transistor over a substrate, the organic field-effect transistor comprising a semiconductor layer including an organic semiconductor material, and a source electrode and a drain electrode formed in contact with the semiconductor layer, wherein the source electrode and the drain electrode each include a same composite layer made of a mixture of an organic compound and a metal oxide.

2. The semiconductor device according to claim 1, wherein the organic compound is an aromatic amine compound.

3. The semiconductor device according to claim 1, wherein the metal oxide is a transition metal oxide.

4. The semiconductor device according to claim 1, wherein the metal oxide is selected from the group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

5. The semiconductor device according to claim 1, wherein the organic semiconductor material is a same material as the organic compound.

6. The semiconductor device according to claim 1, wherein the organic field-effect transistor further comprises a second layer including a material selected from the group consisting of an alkali metal, an alkaline earth metal, an alkali metal compound, and an alkaline earth metal compound, and the second layer is provided to be in contact with the composite layer.

7. The semiconductor device according to claim 1, wherein the organic field-effect transistor further comprises a conductive layer provided to be in contact with the composite layer.

8. The semiconductor device according to claim 1, wherein the semiconductor device is incorporated into an electronic device selected from the group consisting of a liquid crystal display device, a light emitting display device, a mobile phone set, a television set, and an ID card.

9. The semiconductor device according to claim 1, wherein the one of the source electrode and the drain electrode further includes a second layer including a material selected from the group consisting of an alkali metal, an alkaline earth metal, an alkali metal compound, and an alkaline earth metal compound.

10. The semiconductor device according to claim 1, further comprising a second layer including a material selected from the group consisting of an alkali metal, an alkaline earth metal, an alkali metal compound, and an alkaline earth metal compound, and wherein the second layer is interposed between the composite layer and the organic semiconductor material.

11. An organic field-effect transistor comprising:
a semiconductor layer over a substrate, the semiconductor layer including an organic semiconductor material, and a source electrode and a drain electrode formed in contact with the semiconductor layer,
wherein the source electrode and the drain electrode each include an electrically conductive layer and a same composite layer made of a mixture of an organic compound and a metal oxide.

12. The organic field-effect transistor according to claim 11, wherein the organic compound is an aromatic amine compound.

13. The organic field-effect transistor according to claim 11, wherein the metal oxide is a transition metal oxide.

14. The organic field-effect transistor according to claim 11, wherein the metal oxide is selected from the group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

15. The organic field-effect transistor according to claim 11, wherein the organic semiconductor material is a same material as the organic compound.

16. The organic field-effect transistor according to claim 11, wherein the organic field-effect transistor further comprises a second layer including a material selected from the group consisting of an alkali metal, an alkaline earth metal, an alkali metal compound, and an alkaline earth metal compound, and the second layer is provided to be in contact with the composite layer.

17. The organic field-effect transistor according to claim 11, wherein the organic field-effect transistor further comprises a conductive layer provided to be in contact with the composite layer.

18. The organic field-effect transistor according to claim 11, wherein the organic field-effect transistor is incorporated into an electronic device selected from the group consisting of a liquid crystal display device, a light emitting display device, a mobile phone set, a television set, and an ID card.

19. The organic field-effect transistor according to claim 11, wherein the one of the source electrode and the drain electrode further includes a second layer including a material selected from the group consisting of an alkali metal, an alkaline earth metal, an alkali metal compound, and an alkaline earth metal compound.

20. The organic field-effect transistor according to claim 11, further comprising a second layer including a material selected from the group consisting of an alkali metal, an alkaline earth metal, an alkali metal compound, and an alkaline earth metal compound, and wherein the second layer is interposed between the composite layer and the organic semiconductor material.

21. A semiconductor device comprising:
an organic field-effect transistor over a substrate, the organic field-effect transistor comprising a semiconductor layer including an organic semiconductor material, and a source electrode and a drain electrode formed in contact with the semiconductor layer,
wherein the source electrode and the drain electrode each include:
an electrically conductive layer; and
a composite layer made of a mixture of an organic compound and a metal oxide, the composite layer being in direct contact with the organic semiconductor layer.

22. An electronic device incorporating the semiconductor device according to claim 21.

23. A semiconductor device comprising:
an organic field-effect transistor over a substrate, the organic field-effect transistor comprising a semiconductor layer including an organic semiconductor material, and a source electrode and a drain electrode formed in contact with the semiconductor layer,
wherein the source electrode and the drain electrode each include:
an electrically conductive layer;
a composite layer made of a mixture of an organic compound and a metal oxide, and
a second layer including a material selected from the group consisting of an alkali metal, an alkaline earth metal, an alkali metal compound, and an alkaline earth metal compound, the second layer being interposed between the organic semiconductor layer and the composite layer, and in direct contact with the organic semiconductor layer.

24. An electronic device incorporating the semiconductor device according to claim 23.

* * * * *

UNITED STATES PATENT AND TRADEMARK OFFICE
CERTIFICATE OF CORRECTION

| | | |
|---|---|---|
| PATENT NO. | : 8,569,742 B2 | Page 1 of 1 |
| APPLICATION NO. | : 11/792232 | |
| DATED | : October 29, 2013 | |
| INVENTOR(S) | : Ohsawa et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 847 days.

Signed and Sealed this
Seventh Day of April, 2015

Michelle K. Lee
*Director of the United States Patent and Trademark Office*